United States Patent
Leverich

(10) Patent No.: US 8,442,465 B2
(45) Date of Patent: May 14, 2013

(54) SWITCHED CAPACITOR DETUNER FOR LOW NOISE AMPLIFICATION CIRCUIT HAVING BYPASS PATH

(75) Inventor: William Kent Leverich, Jamestown, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 52 days.

(21) Appl. No.: 13/245,948

(22) Filed: Sep. 27, 2011

(65) Prior Publication Data

US 2013/0078937 A1    Mar. 28, 2013

(51) Int. Cl.
*H04B 1/06*    (2006.01)
*H04K 3/00*    (2006.01)

(52) U.S. Cl.
USPC .................. 455/245.2; 455/251.1; 330/51

(58) Field of Classification Search .............. 455/234.1, 455/245.2, 251.1, 253.2; 330/51, 110
See application file for complete search history.

(56) References Cited

U.S. PATENT DOCUMENTS

| | | | |
|---|---|---|---|
| 6,172,566 B1 * | 1/2001 | Nguyen | 330/254 |
| 6,351,183 B1 * | 2/2002 | Khabbaz et al. | 330/51 |
| 6,522,195 B2 * | 2/2003 | Watanabe et al. | 330/51 |

OTHER PUBLICATIONS

Kumar, S. et al., "Enhancement mode PHEMT low noise amplifier with LNA linearity control (IP3) and mitigated bypass switch," IEEE Radio Frequency Integrated Circuits (RFIC) Symposium, Aug. 2002, pp. 213-216.

Hale, C. et al., "A 1 mm^2 flip-chip SP3T switch and low noise amplifier RFIC FEM for 802.11b/g applications," IEEE Radio and Wireless Symposium (RWS), Jan. 2010, pp. 208-211.

Fox, T. et al., "A flip-chip single-pole three-throw switch with integrated bypass LNA for WLAN applications," Proceedings of the 2ndEuropean Wireless Technology Conference, Rome, Italy, Sep. 28-29, 2009, pp. 250-253.

Hasan-Abrar, Z. et al., "A low-voltage, fully-integrated (1.5-6) GHz low-noise amplifier in E-mode pHEMT technology for multiband, multimode applications," Proceedings of the 3rd European Integrated Circuit Conference, Oct. 2008, pp. 306-309.

Morkner, H. et al., "A miniature pHEMT switched-LNA for 800 MHz to 8.0 GHZ handset applications," IEEE Radio Frequency Integrated Circuits (RFIC) Symposium, Jun. 1999, pp. 109-112.

* cited by examiner

*Primary Examiner* — Lee Nguyen
(74) *Attorney, Agent, or Firm* — Withrow & Terranova, P.L.L.C.

(57) ABSTRACT

An RF circuit is disclosed having a low-noise amplification (LNA) circuit and a bypass path that provides a bypass around the LNA circuit. In the amplification mode, the bypass path is open and the LNA circuit amplifies the receive signal in accordance within a power gain frequency response. During the amplification mode, the LNA circuit is tuned such that a power gain resonance frequency band of the power gain frequency response is within the receive frequency band. On the other hand, in the bypass mode, the bypass path is closed and the receive signal is not amplified but rather bypasses the LNA circuit. Also, during the bypass mode, the power gain frequency response of the LNA circuit is transposed to reduce or eliminate excessive insertion losses caused by the LNA circuit within the receive frequency band.

23 Claims, 12 Drawing Sheets

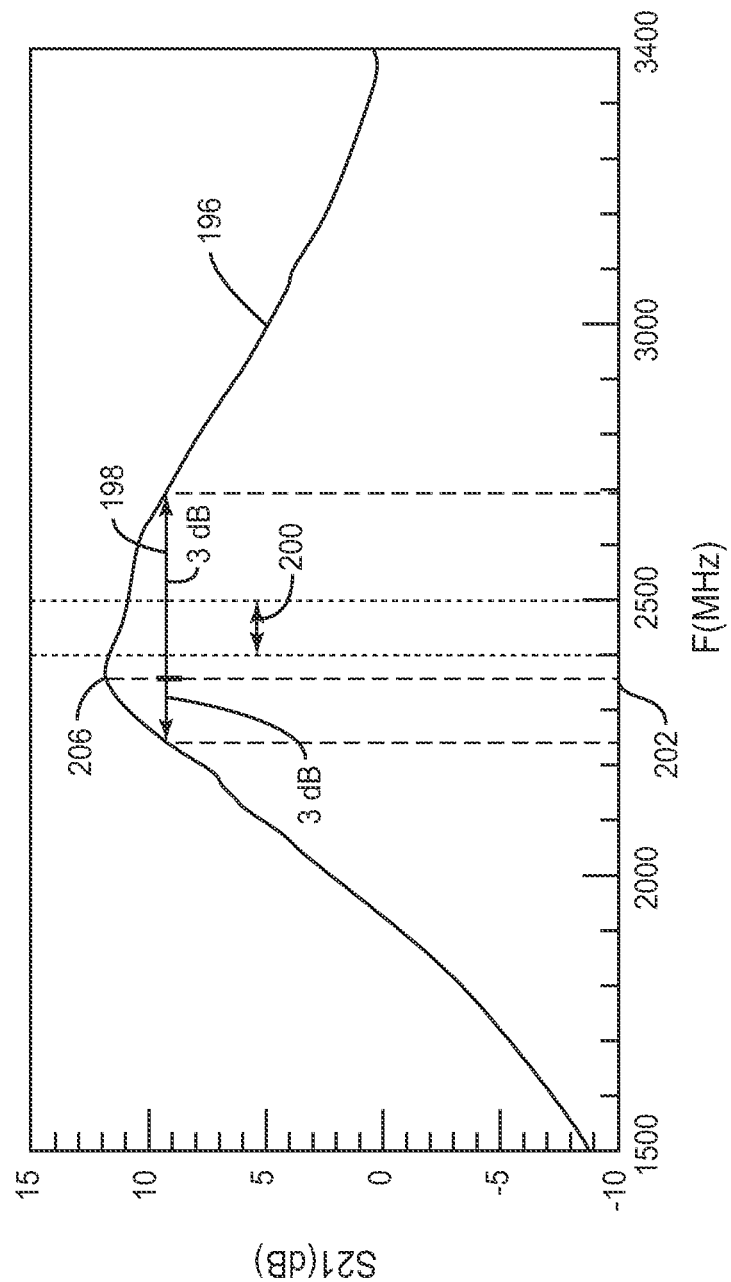

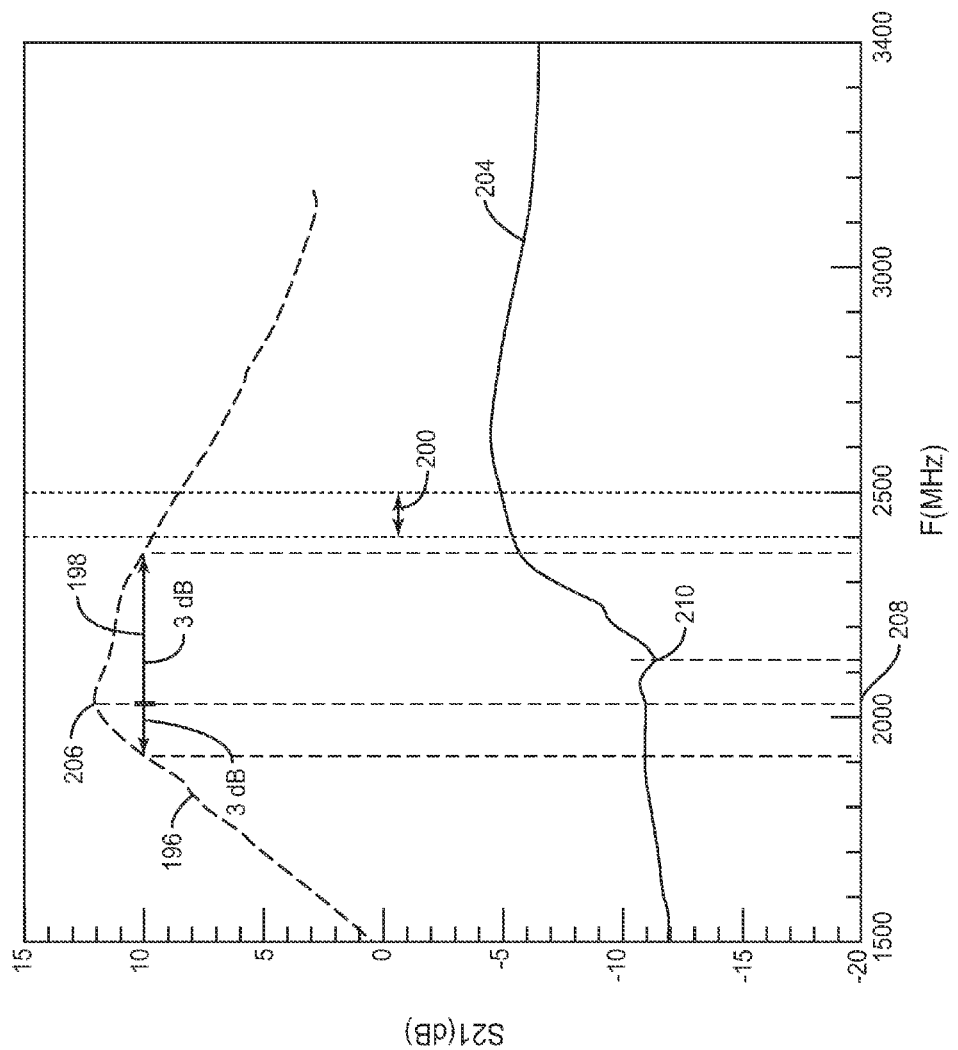

US 8,442,465 B2

SWITCHED CAPACITOR DETUNER FOR LOW NOISE AMPLIFICATION CIRCUIT HAVING BYPASS PATH

FIELD OF THE DISCLOSURE

This disclosure relates generally to low-noise amplification circuits that are coupled to a bypass path and methods of operating the same.

BACKGROUND

Radio frequency (RF) signals typically experience significant losses during propagation from a transmitting antenna to a receiver antenna. Accordingly, when a receive signal is received from on the receiver antenna, the receive signal often needs to be amplified in a receiver so that the receiver signal is provided at an appropriate power level for processing. However, amplifying a signal can introduce noise and thus low-noise amplification (LNA) circuits may be employed to minimize the amount of noise introduced into the receive signal by amplification. LNA circuits amplify the receive signal while being tuned around a receive frequency band associated with the receive signal to reduce the amount of noise introduced during amplification.

Nevertheless, in today's world of mobile communication, mobile communication devices are regularly transported from location to location, thus varying the distance between the transmitting antenna and the receiving antenna. If the receive antenna is too close the transmitting antenna, the receive signal may not need to be amplified or the amplification by the LNA circuit may be at a power level that is too high. As a result, the receiver may be structured to have an RF circuit that includes the LNA circuit and a bypass path coupled to provide a bypass for the receive signal around the LNA circuit. In an amplification mode, the bypass path of the RF circuit is opened allowing the LNA circuit to amplify the receive signal. On the other hand, in a bypass mode, the bypass path of the RF circuit is closed and the receive bypasses the LNA circuit.

Unfortunately, while tuning the LNA circuit to the receive frequency band reduces noise during amplification, it introduces a maximum attenuation peak near the receive frequency band, which may introduce high insertion losses to the receiver signal in bypass mode. FIG. 1 illustrates the $S_{21}$ response of a prior art RF circuit and includes a power gain frequency response 10 of a prior art LNA circuit during the amplification mode and the attenuation frequency response 12 of a prior art bypass path during the bypass mode. As shown in FIG. 1, the LNA circuit is tuned so that a power gain resonance frequency band 14 of the power gain frequency response 10 is well within a receive frequency band 16 of the receive signal. In fact, in this case a resonant frequency 18 of the power gain resonance frequency band 14 is provided so that, in the amplification mode, the maximum gain is provided in the middle of the receive band 16. However, the LNA circuit also loads the bypass path and this same tuning of the LNA circuit creates a notch 20 in the attenuation frequency response 12. This introduces excessive insertion losses in the bypass path. In other words, a maximum attenuation resonance frequency 22 of the notch 20 is too close to the receive frequency band 16 in the bypass mode and a notch band 24 includes the receive frequency band 16 of the receive signal.

Attempts have been made to solve this problem. FIG. 2 illustrates the $S_{21}$ response of another prior art RF circuit having the power gain frequency response 10 of another prior art LNA circuit during the amplification mode and the attenuation frequency response 12 of another prior art bypass path during the bypass mode. In this case, the notch band 24 has been provided outside of the receive frequency band 16 and thus the bypass path provides lower insertion losses during the bypass mode. On the other hand, this was accomplished by tuning the LNA circuit so that the resonant frequency 18 of the power gain resonance frequency band 14 is further away from the receive frequency band 16. While the receive frequency band 16 is still within the power gain resonance frequency band 14, the receive frequency band 16 is closer to the edges of the power gain resonance frequency band 14. As a result, during the amplification mode, the LNA circuit amplifies the receive signal with less gain and may introduce greater amounts of noise into the receive signal.

What is needed is an RF circuit and methods of operating the same that provide a higher gain to amplify the receive signal during the amplification mode but do not introduce large insertion losses during the bypass mode.

SUMMARY

In one embodiment, a radio frequency (RF) circuit is disclosed, which has a low-noise amplification (LNA) circuit and a bypass path operably associated with the LNA circuit. The LNA circuit is operable to amplify a receive signal in accordance to a power gain frequency response of the LNA circuit. The LNA circuit may be tuned so that the power gain frequency response of the LNA circuit defines a power gain resonance frequency band. The bypass path provides a bypass for a receive signal around the LNA circuit. In an amplification mode, the LNA circuit is configured to provide the power gain frequency response such that a receive frequency band of the receive signal is within the power gain resonance frequency band. The bypass path is configured to be open so that the LNA circuit amplifies the receive signal. On the other hand, during a bypass mode, the bypass path is configured to be closed so that the receive signal bypasses the LNA circuit. During the bypass mode, the LNA circuit does not amplify the receive signal however, the power gain frequency response of the LNA circuit is transposed so that the power gain resonance frequency band of the power gain frequency response is outside the receive frequency band. Although the LNA circuit may load the bypass path, the RF circuit reduces or eliminates the effect of the loading on the bypass path in the bypass mode. In this manner, the tuning of the LNA circuit can be optimized to provide greater gain during the amplification mode while not introducing excessive insertion losses in the bypass mode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 11A is a $S_{21}$ response of the RF circuit shown in FIG. 9 when the RF circuit is in an amplification mode.

FIG. 11B is the $S_{21}$ response of the RF circuit shown in FIG. 9, when the RF circuit is in a bypass mode.

DETAILED DESCRIPTION

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 3:
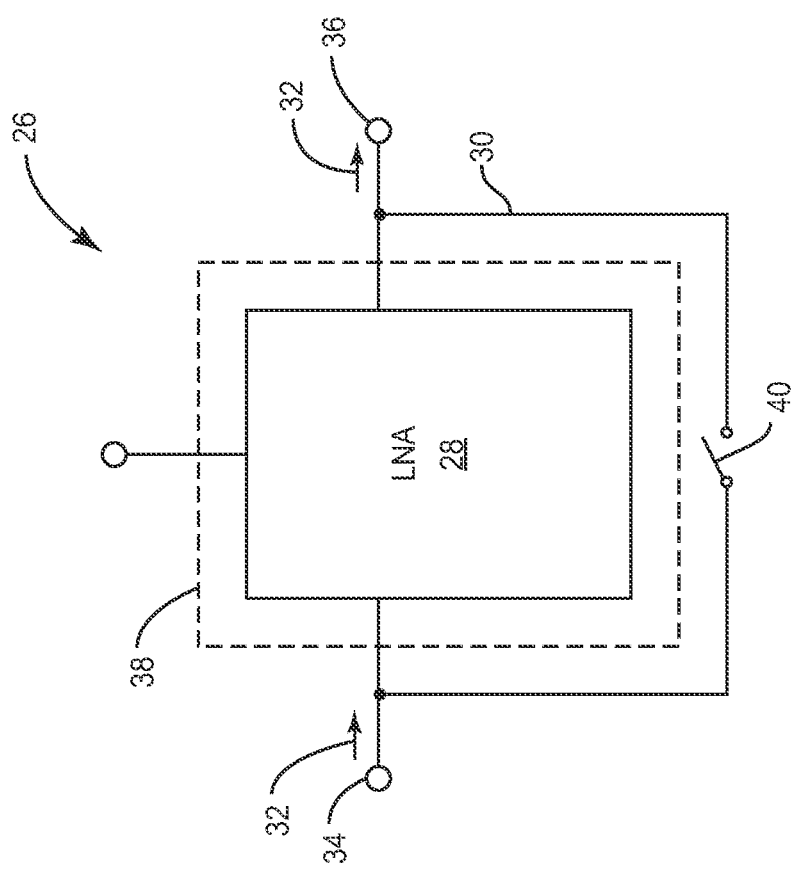
FIG. 3 is a block diagram of one embodiment of an RF circuit in accordance with this disclosure.

FIG. 3 illustrates one embodiment of a radio frequency (RF) circuit 26 in accordance with this disclosure. The RF circuit 26 has a low-noise amplification (LNA) circuit 28 and a bypass path 30. To receive and output a receive signal 32, the RF circuit 26 includes an input terminal 34 and an output terminal 36. The LNA circuit 28 is coupled between the input terminal 34 and the output terminal 36 so that the RF circuit 26 forms an amplification path 38. The amplification path 38, through the LNA circuit 28, is operable to amplify the receive signal 32 in accordance with a power gain frequency response of the LNA circuit 28. In an amplification mode, the receive signal 32 is transmitted through the amplification path 38 and amplified by the LNA circuit 28. On the other hand, in a bypass mode, the receive signal 32 bypasses the LNA circuit 28 and is transmitted through the bypass path 30. In this embodiment, the bypass path 30 is also coupled to the input terminal 34 and the output terminal 36 but in parallel with the LNA circuit 28. Accordingly, the receive signal 32 is transmitted through the amplification path 38 and amplified by the LNA circuit 28 during the amplification mode. On the other hand, the receive signal 32 is transmitted through the bypass path 30 and is unamplified by the LNA circuit 28 in the bypass mode. Thus, in the amplification mode, the output terminal 36 outputs the receive signal 32 after amplification by the LNA circuit 28, while, during the bypass mode, the output terminal 36 outputs the receive signal 32 with minimal attenuation by the bypass path 30.

To alternate to and from the amplification mode and bypass mode, the bypass path 30 is opened and closed. When the bypass path 30 is open, the receive signal 32 is amplified through the amplification path 38 utilizing the LNA circuit 28. The bypass path 30 is closed in the bypass mode so that the receive signal 32 bypasses the amplification path 38. A switch 40 is provided in this embodiment to open and close the bypass path 30. In this example, the switch 40 is a transistor that is turned off and presents a high impedance relative to the impedance of the LNA circuit 28 when the bypass path 30 is open. The transistor is turned on and presents a relatively low impedance when the bypass path 30 is closed. However, any suitable apparatus or circuit design may be utilized to open and close the bypass path 30. For instance, other embodiments of the switch 40 may utilize more than one transistor and have a circuit topology configured to allow the opening and closing of the bypass path 30. Other embodiments may use one or more mechanical switches, such as microelectromechanical switches, which open and close the bypass path 30 mechanically.

Figure 4:
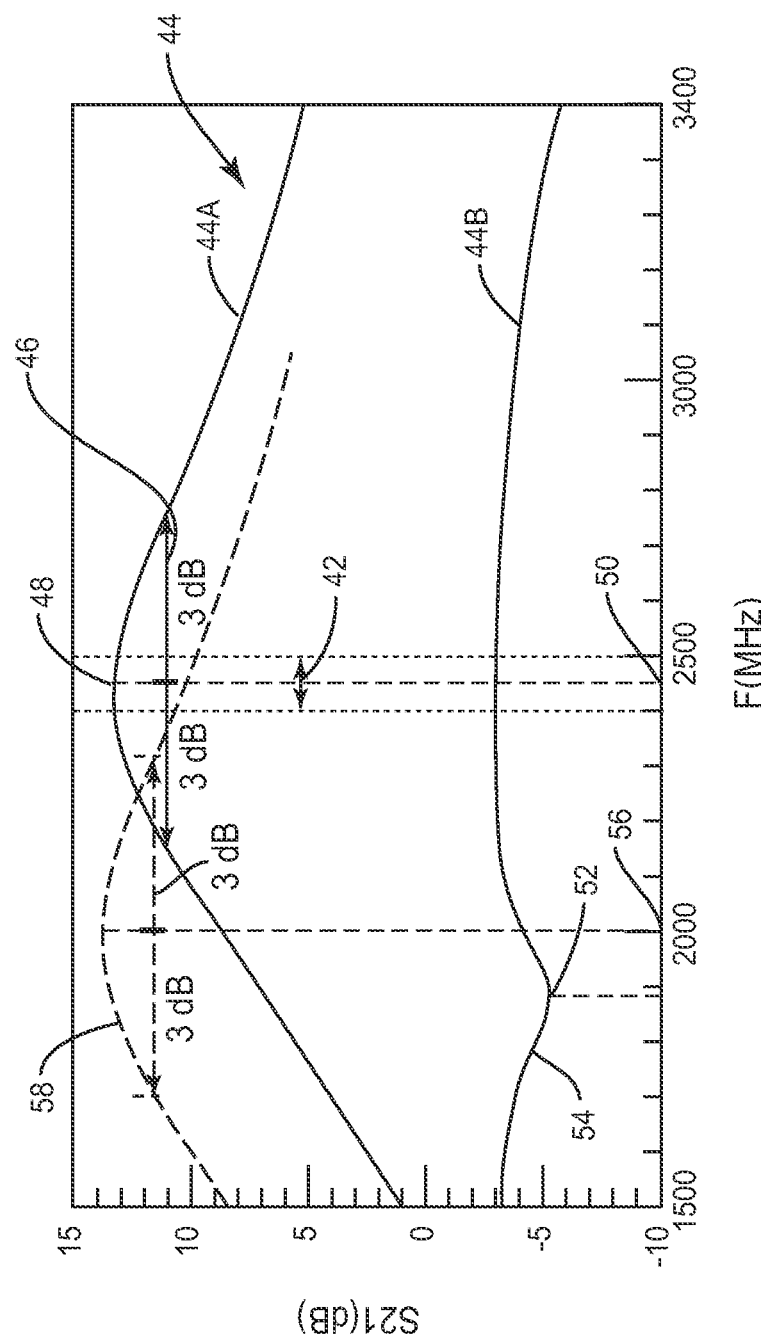
FIG. 4 is a $S_{21}$ response of the RF circuit shown in FIG. 3 and illustrates a power gain frequency response of the RF circuit when the RF circuit is in an amplification mode and an attenuation frequency response when the RF circuit is in a bypass mode.

Referring now to FIGS. 3 and 4, FIG. 4 illustrates a $S_{21}$ response 44 of the RF circuit 26 illustrated in FIG. 3. The RF circuit 26 may be coupled to an antenna (not shown) and an antenna tuner (not shown) operable to tune the antenna to a receive frequency band 42. The receive signal 32 is received within the receive frequency band 42, which in this example is between 2400 to 2500 MHz. The $S_{21}$ response 44 of the RF circuit 26 has an $S_{21}$ response 44A in the amplification mode and an $S_{21}$ response 44B in the bypass mode. The $S_{21}$ response 44A of the RF circuit 26 is essentially the power gain frequency response 44A of the LNA circuit 28 during the amplification mode. The LNA circuit 28 is operable to amplify the receive signal 32 in accordance with the power gain frequency response 44A. As shown in FIG. 4, the power gain frequency response 44A defines a power gain resonance frequency band 46. To define the power gain resonance frequency band 46, the LNA circuit 28 may be tuned to resonate at a resonant frequency 48, which is at frequency location 50 during the amplification mode. In this manner, the receive frequency band 42 of the receive signal 32 is within the power gain resonance frequency band 46 in the amplification mode. Generally, the power gain resonance frequency band 46 is defined as a frequency band within 3 decibels (dB) of the resonant frequency 48.

As discussed above, the RF circuit 26 is operable to switch from the amplification mode to the bypass mode, and vice versa. During the bypass mode, the RF circuit 26 has the $S_{21}$ response 44B. In this embodiment, the $S_{21}$ response 44B of the RF circuit 26 is an attenuation frequency response 44B of the bypass path 30 and the bypass path 30 is operable to attenuate the receive signal 32 in accordance with the attenuation frequency response 44B. Note, however, that the tuning of the LNA circuit 28 has an effect on the attenuation frequency response 44B. The attenuation frequency response 44B defines a maximum attenuation resonance frequency 52 because the bypass path 30 is coupled to the LNA circuit 28. The maximum attenuation resonance frequency 52 is a local minima in the attenuation frequency response 44B due to the resonance of the LNA circuit 28. A location of the maximum attenuation resonance frequency 52 of a notch 54 is related to the resonant frequency 48 of the LNA circuit 28. In essence, the low impedance presented by the LNA circuit 28 in the power gain resonance frequency band 46 creates an alternate path for signals near the resonant frequency 48 of the LNA circuit 28. This increases the attenuation of the attenuation frequency response 44B near the resonant frequency 48. In this embodiment, the LNA circuit 28 causes the notch 54, which has the maximum attenuation resonance frequency 52.

To eliminate or reduce the effect of this increased attenuation on the receive signal 32, the LNA circuit 28 is detuned and the resonant frequency 48 is shifted to frequency location 56 during the bypass mode. This in turn has shifted the maximum attenuation resonance frequency 52 of the attenuation frequency response away from the receive frequency band 42. In this manner, the LNA circuit 28 provides the power gain frequency response 44A such that the receive frequency band 42 is outside of the power gain resonance frequency band 46. As shown by line 58, which represents the power gain frequency response 44A of the LNA circuit 28 during the bypass mode, the frequency location 56 of the resonant frequency 48 shifts the power gain resonance frequency band 46 of line 58 outside of the receive frequency band 42. The resonant frequency 48 at frequency location 56 of line 58 is 3 dB from the receive frequency band 42 during the bypass mode. In this manner, the maximum attenuation resonance frequency 52 has been shifted away from the receive frequency band 42 and the effects of the increased attenuation on the receive signal 32 during the bypass mode are eliminated or reduced. For example, the LNA circuit 28 has been detuned such that the receive frequency band 42 is outside the notch 54 in the bypass mode.

Figure 5:
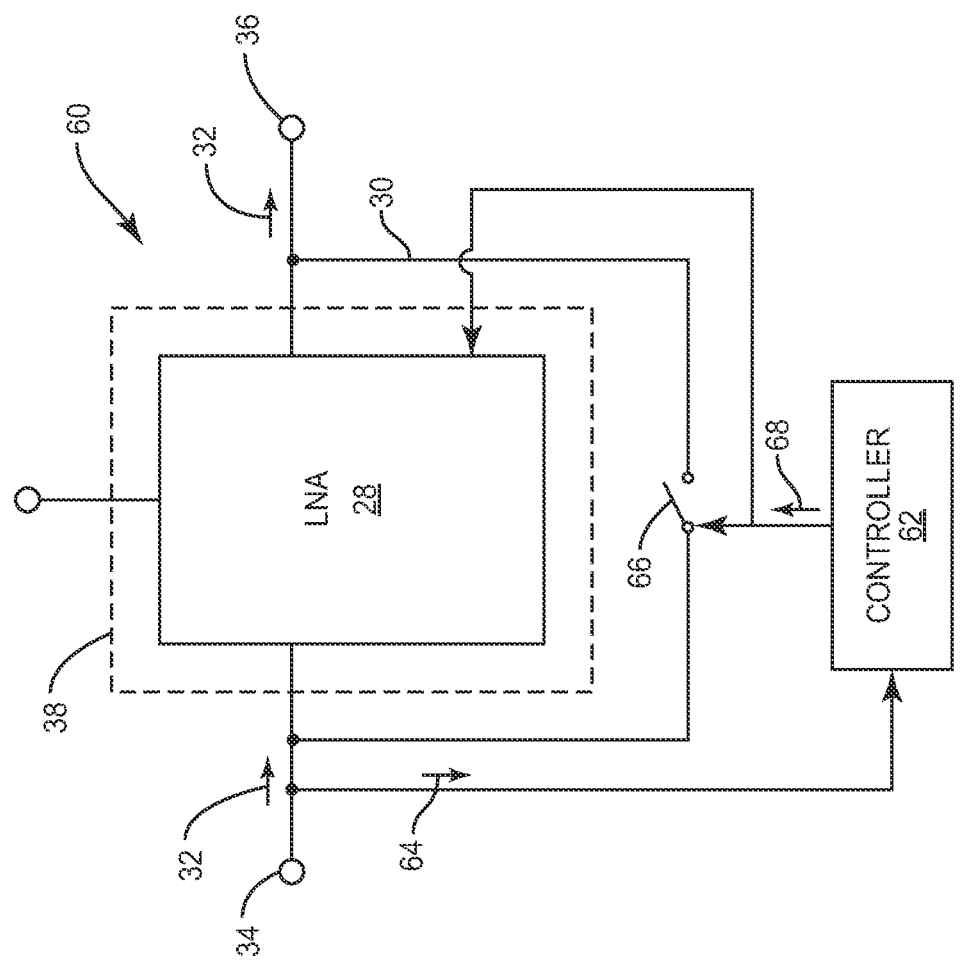
FIG. 5 is a block diagram of a second embodiment of an RF circuit in accordance with this disclosure.

FIG. 5 illustrates another embodiment of an RF circuit 60 in accordance with this disclosure. The RF circuit 60 is similar to the RF circuit 26 shown in FIG. 3 and operates as described above in FIG. 4. In this embodiment however, the RF circuit 60 also includes a controller 62 that controls the operation of the bypass path 30 and the amplification path 38. In some embodiments, the controller 62 may be integrated with a circuitry of the RF circuit 60 while in other embodiments the controller 62 is formed with separate circuitry and devices.

The controller 62 may have any suitable configuration to control the RF circuit 60. For example, the controller 62 may be implemented using general purpose computing hardware, such as one or more microprocessors, computer executable instructions stored in memory. When the computer executable instructions are executed by the microprocessors, the controller 62 provides a software module with the desired control functionality. On the other hand, the controller 62 may be formed by a hardwired hardware circuit specifically built to provide the desired control functionality. Alternatively, the controller 62 may provide the desired control functionality through some combination of software modules and hardwired hardware circuitry. Also, the controller 62 may be the controller 62 utilized to control a receiver or transceiver and thus may have to be configured to have additional control functionality for other circuit components and not just the control functionality provided for the RF circuit 60. The RF circuit 60 may be provided within a receiver chain of a receiver (not shown) or the transceiver so that the LNA circuit 28 provides low-noise amplification of the receive signal 32 in accordance with the power gain frequency response 44A during the amplification mode and attenuation in accordance with the attenuation frequency response 44B during the bypass mode.

Referring now to FIGS. 4 and 5, the controller 62 controls the RF circuit 60 so that the RF circuit 60 is in an amplification mode if a signal level of the receive signal 32 at the input terminal 34 is below a threshold level but is in a bypass mode if the signal level of the receive signal 32 at the input terminal 34 is above the threshold level. The threshold level of the receive signal 32 may be a level at which amplification of the receive signal 32 by the LNA circuit 28 becomes unnecessary or detrimental. For example, once the receive signal 32 at the input terminal 34 is at the threshold level or higher, amplification of the receive signal 32 may become unnecessary or may cause inputs greater than the operational limitations of the circuit components coupled to the RF circuit 60 at output terminal 36.

One exemplary use of the RF circuit 60 is for use within the receiver chain of a receiver or transceiver for a mobile communications device, such as a cellular telephone, laptop, and the like. As the mobile communication device is transported to different locations, a distance between the mobile communications device and a source of the receive signal 32 varies. The signal level of the receive signal 32 generally increases as the distance between the receiver or the transceiver and the source decreases and vice versa. The controller 62 is operable to sense the signal level of the receive signal 32. If the mobile communication device is at a distance greater than a threshold distance from the source, the signal level of the receive signal 32 is below the threshold level at the input terminal 34. The controller 62 senses that the signal level of the receive signal 32 is below the threshold level and, in response, is configured to open the bypass path 30 so that the RF circuit 60 operates in the amplification mode. The power gain frequency response 44A of the amplification path 38 is provided with the power gain resonance frequency band 46 that includes the receive frequency band 42. The resonant frequency 48 is provided at frequency location 50 and the RF circuit 60 amplifies the receive signal 32 in accordance with the power gain frequency response 44A.

On the other hand, when the mobile communication device is at or within the threshold distance, the signal level of the receive signal 32 is at or above the threshold level. The controller 62 senses that the signal level of the receive signal 32 is at or above the threshold level and, in response, is configured to close the bypass path 30 so that the RF circuit 60 operates in the bypass mode and the receive signal 32 bypasses the amplification path 38. The power gain frequency response 44A is provided, as shown by line 58 in FIG. 4, with the resonant frequency 48 transposed to frequency location 56 and the power gain resonance frequency band 46 transposed outside the receive frequency band 42.

To sense the signal level of the receive signal 32, the controller 62 may be coupled to receive a feedback signal 64 from the input terminal 34. Alternatively, the controller 62 may simply receive the receive signal 32 directly or after the receive signal 32 has been processed by the receiver chain. The bypass path 30 has a switch 66 and the bypass path 30 is opened and closed by opening and closing the switch 66. In this embodiment, the controller 62 generates a control signal 68 based on the signal level of the receive signal 32, as determined from the feedback signal 64. Both the switch 66 and the LNA circuit 28 are coupled to receive the control signal 68 from the controller 62. The controller 62 generates the control signal 68 and the control signal 68 is operable to both operate the switch 66 and adjust the tuning of the LNA circuit 28. Thus, this embodiment of the controller 62 controls whether the RF circuit 60 is in the amplification mode or the bypass mode with just the single control signal 68.

In other embodiments, a feedback signal 64 from the input terminal 34 may not be practical in some applications. In these circumstances, a common implementation may be that processing by the receiver chain provides the control for controller 62.

Figure 6:
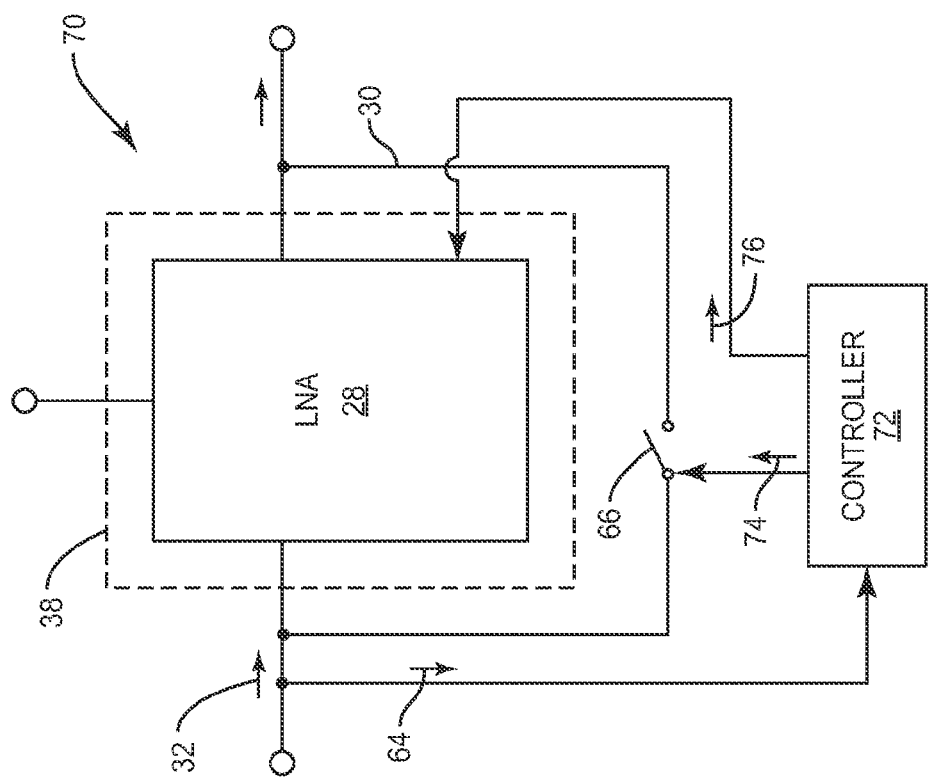
FIG. 6 is a block diagram of a third embodiment of an RF circuit in accordance with this disclosure.

FIG. 6 illustrates another embodiment of an RF circuit 70. The RF circuit 70 is similar to the RF circuit 60, except the RF circuit 70 has a different embodiment of a controller 72. Unlike the previous embodiment, the controller 72 is operable to generate a first control signal 74 and a second control signal 76. Both the first control signal 74 and the second control signal 76 are based on the signal level of the receive signal 32, as indicated by the feedback signal 64. The switch 66 is coupled to the controller 72 so as to receive the first control signal 74 and the first control signal 74 is configured to open and close the switch 66. The LNA circuit 28 is coupled to the controller 72 so as to receive the second control signal 76 and the second control signal 76 is configured to adjust the tuning of the LNA circuit 28.

Figure 1:
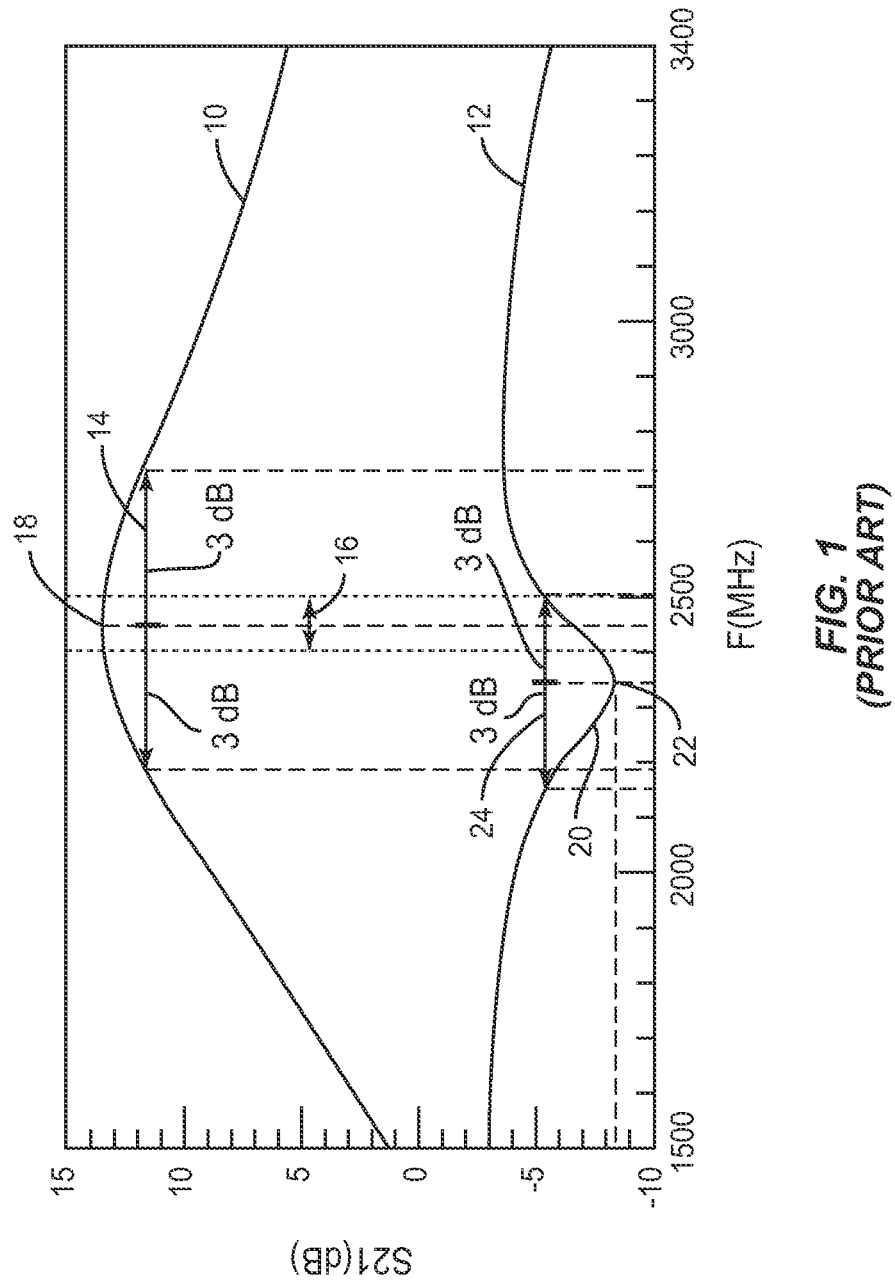
FIG. 1 is a $S_{21}$ response of a prior art RF circuit illustrating a power gain frequency response of the prior art RF circuit when the prior art RF circuit is in an amplification mode and an attenuation frequency response when the RF circuit is in a bypass mode.
Figure 2:
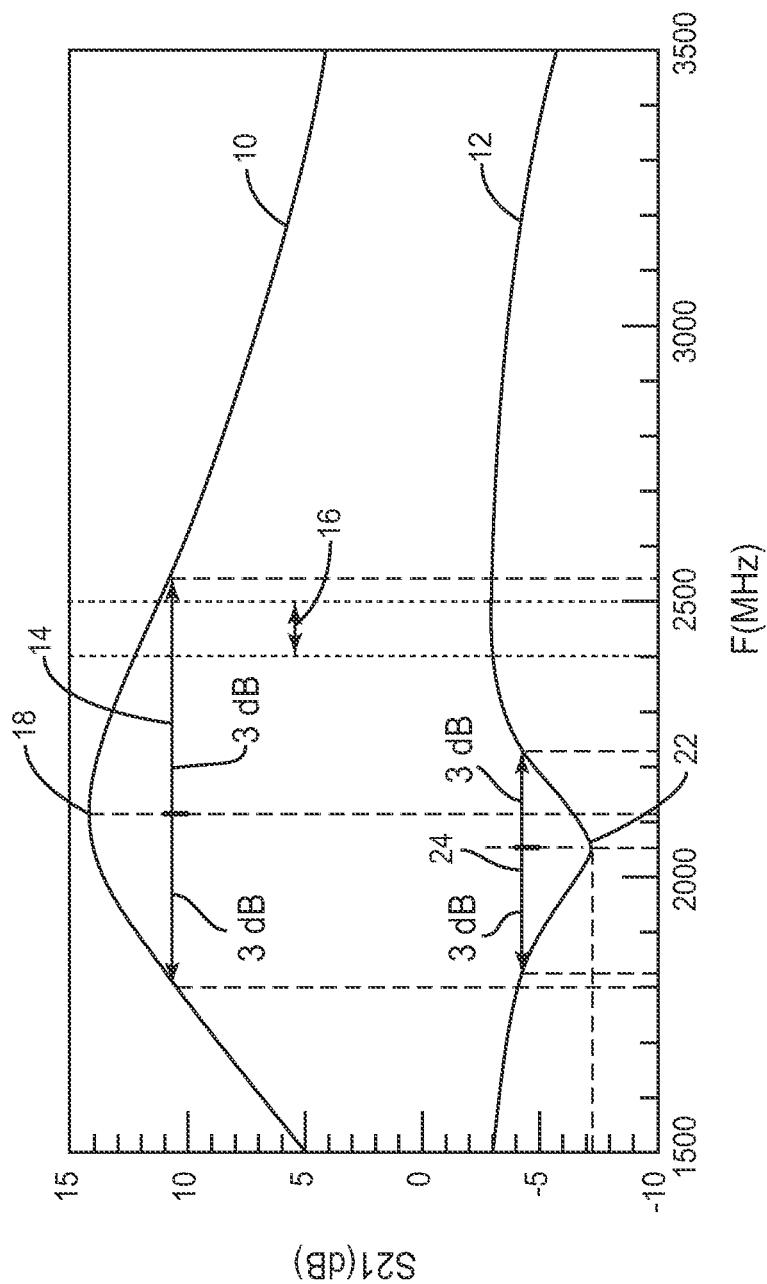
FIG. 2 is a $S_{21}$ response of another prior art RF circuit illustrating a power gain frequency response of the prior art RF circuit when the prior art RF circuit is in an amplification mode and an attenuation frequency response when the RF circuit is in a bypass mode.
Figure 7:
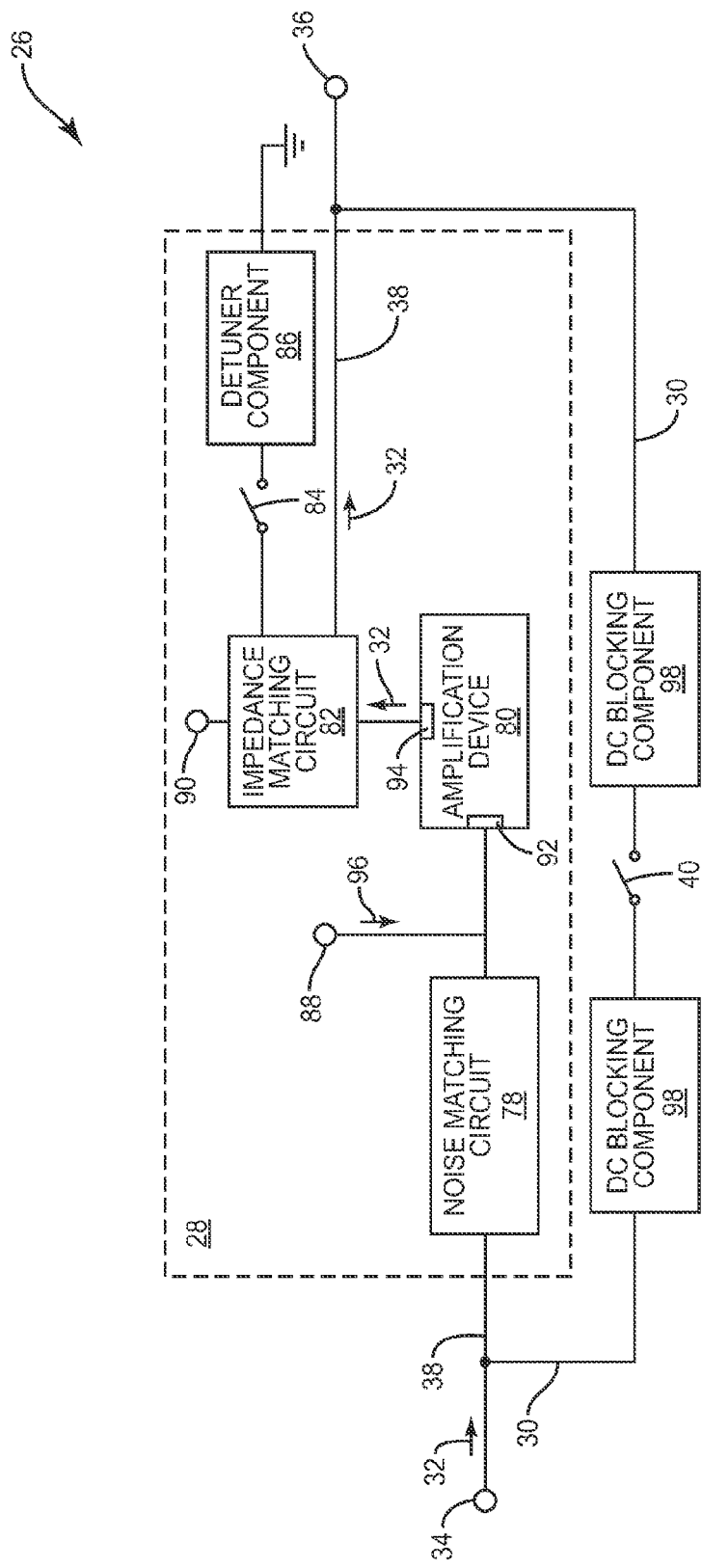
FIG. 7 is a block diagram of a fourth embodiment of an RF circuit and illustrates a more detailed example of the RF circuit shown in FIG. 3.

Referring now to FIG. 7, FIG. 7 illustrates a more detailed block diagram of one exemplary embodiment of the RF circuit 26 illustrated in FIG. 1. The LNA circuit 28 shown in FIG. 7 includes a noise matching circuit 78, an amplification device 80, an impedance matching circuit 82, a switch 84, a detuner component 86, a biasing terminal 88, and a power terminal 90. The amplification device 80 is operable to provide amplification and may be any amplification device 80 suitable for use in an LNA circuit 28. For example, the amplification device 80 may be a transistor, or any combination of transistors, an op-amp, a power amplifier, a voltage amplifier, a current amplifier, a distributed amplifier, and/or the like. The amplification device 80 includes an input contact 92 operably associated with the input terminal 34 and an output contact 94. The amplification device 80 receives the receive signal 32 at the input contact 92. The noise matching circuit 78 may be coupled between the input contact 92 and the input terminal 34 to improve noise performance, to help tune amplification device 80, and to block DC and other low frequency components.

In some embodiments of the LNA circuit 28, such as the one illustrated in FIG. 7, the signal level of the receive signal 32 may need to be adjusted so that the receive signal 32 is provided at the input contact 92 within an operating range of the amplification device 80. To adjust the receive signal 32, a biasing terminal 88 may also be coupled to the input contact 92 of the amplification device 80. The biasing terminal 88 receives a biasing signal 96 having a bias level. The biasing signal 96 is applied to the receive signal 32 so that the biasing level of the biasing signal 96 provides the receive signal 32 within the operating range of the amplification device 80. The biasing signal 96 may be a DC signal so that the bias level is constant or substantially constant. In other embodiments, there may be designed variations in the bias level. This of course will depend on the type of the amplification device 80 and the application of the RF circuit 26. When the LNA circuit 28 is in bypass mode, the amplification device 80 may be shut down. For example, the biasing signal 96 may be adjusted at the biasing terminal 88 so as to shut down the amplification device 80.

The output contact 94 of the amplification device 80 is configured to output the receive signal 32 from the amplification device 80 once the receive signal 32 has been amplified by the amplification device 80. The impedance matching circuit 82 is coupled between the power terminal 90 and the output contact 94 of the amplification device 80. The power terminal 90 may receive a voltage from a power source to drive amplification of the amplification device 80. As explained in further detail below, the impedance matching circuit 82 may be configured to increase power transfer from the power terminal 90 to the output contact 94. In this embodiment, the impedance matching circuit 82 is also tuned to provide the power gain frequency response 44A so that the power gain resonance frequency band 46 (shown in FIG. 4) is within the receive frequency band 42 (shown in FIG. 4). The output terminal 36 is coupled to the impedance matching circuit 82 to output the receive signal 32 from the LNA circuit 28.

The LNA circuit 28 shown in FIG. 7 also includes the detuner component 86 and the switch 84. The detuner component 86 may be any type of component that effects the tuning of the LNA circuit 28. For example, the detuner component 86 may be a capacitor, inductor, or any combination of capacitors and inductors. The switch 84 may be a transistor, a combination of transistors, or a mechanical switch, such as a microelectromechanical switch. In the amplification mode, the switch 84 is configured to be opened and the detuner component 86 does not affect the tuning of the LNA circuit 28. Thus, the LNA circuit 28 is tuned in accordance with the tuning provided by the impedance matching circuit 82 and the power gain resonance frequency band 46 is provided within the receive frequency band 42 during the amplification mode. However, in the bypass mode, the switch 84 is configured to be closed. The detuner component 86 thus detunes the tuning provided by the impedance matching circuit 82 during the bypass mode. As a result, the power gain frequency response 44A is transposed so that the power gain resonance frequency band 46 of the LNA circuit 28 is outside the receive frequency band 42, as shown by line 58 in FIG. 4. As discussed above, the bypass path 30 includes the switch 40, which is also closed during the amplification mode. The receive signal 32 bypasses the LNA circuit 28 and is attenuated by the bypass path 30. The bypass path 30 may include DC blocking components 98 that block DC frequency components during the bypass mode.

Figure 8:
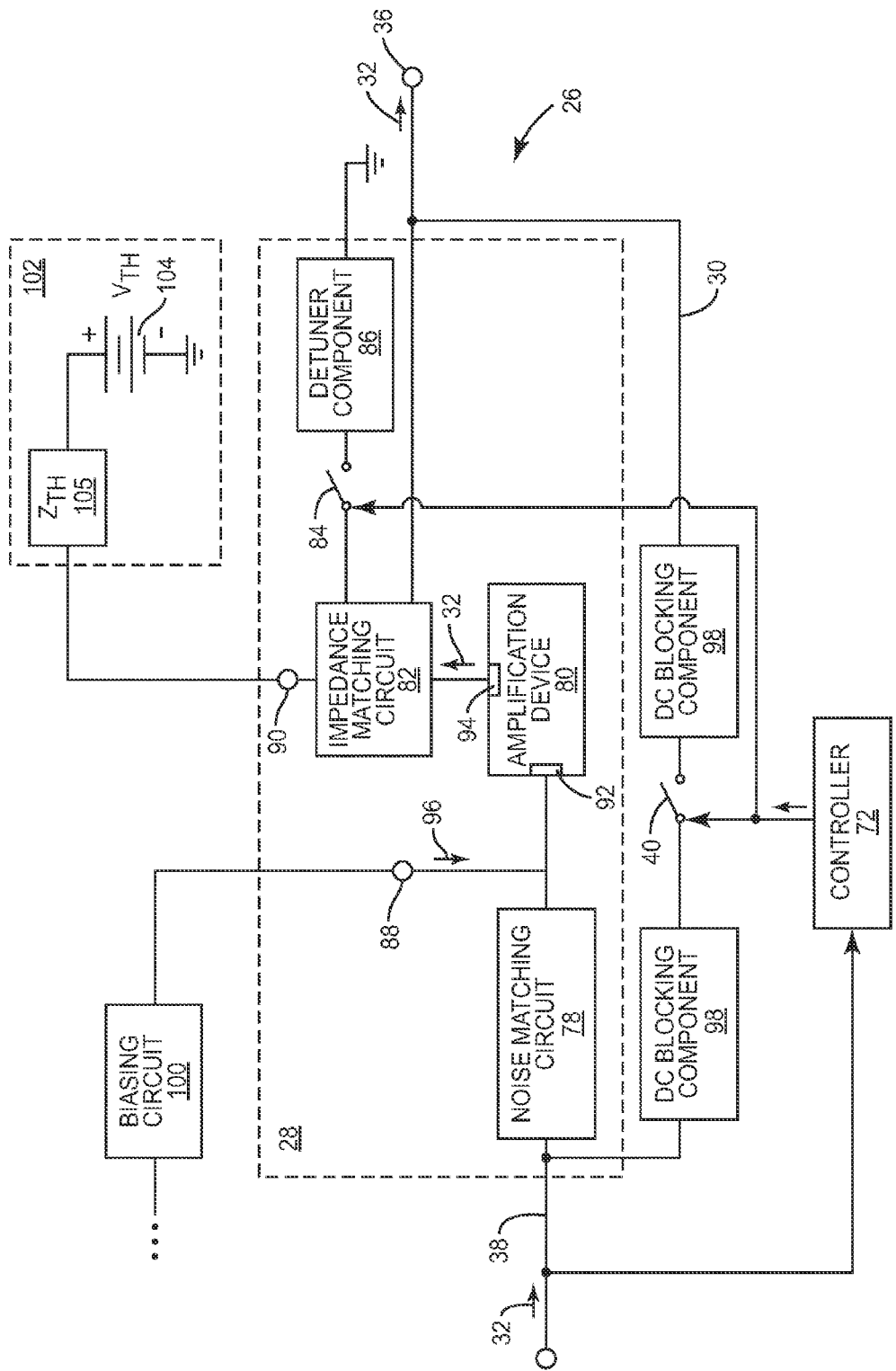
FIG. 8 is a block diagram of the RF circuit shown in FIG. 3 coupled to a controller, biasing circuit, and a power source.

Referring now to FIG. 8, FIG. 8 illustrates the RF circuit 26 shown in FIG. 7 coupled to various other components. In this embodiment, the RF circuit 26 includes the embodiment of the controller 62 discussed above in FIG. 5. As discussed above, both the switch 40 in the bypass path 30 and the switch 84 in the LNA circuit 28 are closed in the bypass mode. Similarly, the switch 40 and the switch 84 are open in the amplification mode. The controller 62 is operable to control both switch 40 and switch 84 with the control signal 68. The switch 40 and the switch 84 may be the same or similar switches such as, for example, transistors with similar operational characteristics. Alternatively, the switch 40 and the switch 84 may be different but the LNA circuit 28 may be configured to apply the appropriate signal levels so that both the switch 40 and the switch 84 can be controlled utilizing the same control signal 68. In yet another alternative, the controller 72 illustrated in FIG. 8 may control the switch 40 and the switch 84 by generating the first control signal 74 and the second control signal 76. The controller 72 may be configured so that the first control signal 74 is designed to specifically control the switch 40 while the second control signal 76 is designed to specifically control the switch 84.

FIG. 8 also illustrates a biasing circuit 100 that generates the biasing signal 96. The biasing circuit 100 generates the biasing signal 96 and is coupled through the biasing terminal 88 to apply the biasing signal 96 to the receive signal 32. In this manner, at the input contact 92 of the amplification device 80. The biasing circuit 100 may be a DC source or may be designed to provide designed variations in the bias level of the biasing signal 96. For example, the biasing signal 96 may be varied to compensate for local thermal variations in the temperature of the amplification device 80. Furthermore, the biasing circuit 100 may be formed by a separate circuit or may be integrated into the circuitry of the RF circuit 26. The biasing circuit 100 may also be formed as part of the controller 62 or may be a separate circuit. Also, when the LNA circuit 28 is in bypass mode, the biasing circuit 100 may be operable to adjust the biasing signal 96 at the biasing terminal 88 so that the amplification device 80 is shut down.

Next, the power terminal 90 is coupled to a power source 102. The power source 102 is modeled as a Thevenin equivalent circuit in FIG. 8 and may represent a DC source, an AC source, or simply a node from an external circuit. In this embodiment, the power source 102 is modeled as a voltage source 104 and a complex source impedance 105. The voltage from the power source 102 is received at the power terminal 90 that drives amplification of the amplification device 80. As mentioned above, the impedance matching circuit 82 is configured to increase power transfer from the power terminal 90 to the output contact 94 of the amplification device 80. To do this, the impedance matching circuit 82 may be configured to match the complex source impedance 105 of the power source 102. This helps maximize power transfer to the amplification device 80 from the power source 102.

Referring now to FIGS. 4 and 8, the impedance matching circuit 82 in FIG. 8 is tuned so that the power gain frequency response 44A of the LNA circuit 28 has the receive frequency band 42 within the power gain resonance frequency band 46. As discussed above, the detuner component 86 does not affect the tuning of the impedance matching circuit 82 during the amplification mode and consequently, the tuning provided by the impedance matching circuit 82 places the power gain resonance frequency band 46 so that the receive frequency band 42 is within the power gain resonance frequency band 46 during the amplification mode. To provide tuning, the impedance matching circuit 82 may provide matching at the output terminal 36 within or near the receive frequency band 42. In the example illustrated in FIG. 4, the resonant frequency 48 of the power gain resonance frequency band 46 is at the frequency location 50 during the amplification mode and thus matching occurs at the frequency location 50. The frequency location 50 is within the receive frequency band 42. However, as explained in further detail below, this is not necessarily the case. Rather, the impedance matching circuit 82 simply needs to be tuned to provide the power gain frequency response 44A so that the receive frequency band 42 is within the power gain resonance frequency band 46. If the power gain resonance frequency band 46 is wider than the receive frequency band 42, as in FIG. 4, the resonant frequency 48 may but does not need to be within the receive frequency band 42 during the amplification mode.

The impedance matching circuit 82 in FIG. 8 thus provides matching at the power terminal 90 and at the output terminal 36. The impedance matching circuit 82 thus may be configured as a pi network, a T network, an H-network, an L-section or some combination of these networks. These networks may be balanced or unbalanced and may include either active or passive network components.

Figure 9:
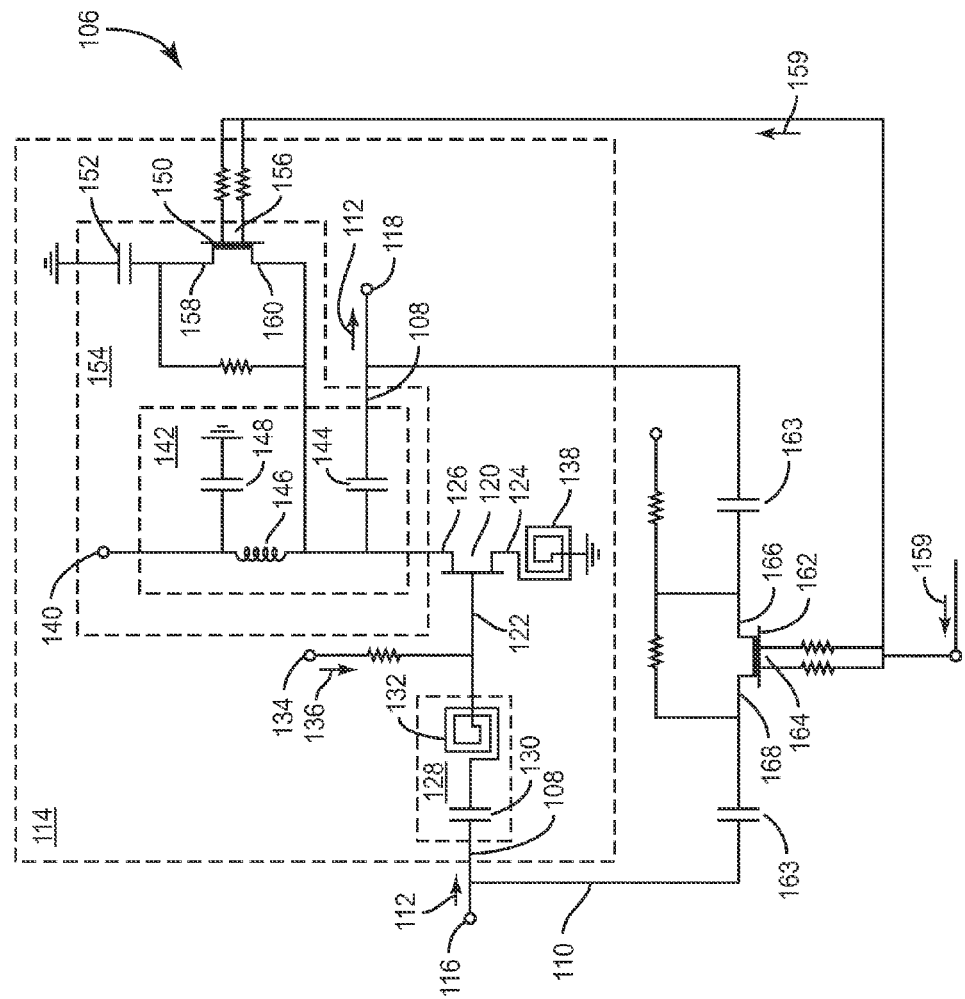
FIG. 9 is a circuit diagram of a fifth embodiment of an RF circuit in accordance with this disclosure.

Referring now to FIG. 9, FIG. 9 illustrates a circuit diagram of one embodiment of an RF circuit 106. The RF circuit 106 has an amplification path 108 and a bypass path 110. The amplification path 108 is operable to amplify a receive signal 112 in accordance with a power gain frequency response of the amplification path 108 and the bypass path 110. To amplify the receive signal 112 in accordance with the power gain frequency response, the amplification path 108 has an LNA circuit 114. The bypass path 110 is coupled to provide a bypass around the amplification path 108. In this embodiment, the bypass path 110 is coupled in parallel with the amplification path 108. Both the amplification path 108 and the bypass path 110 are coupled between an input terminal 116 and an output terminal 118. In the amplification mode, the bypass path 110 is open and the receive signal 112 is received from the input terminal 116 and transmitted through the amplification path 108. The receive signal 112 is amplified in accordance with the power gain frequency response of the amplification path 108 and output from the output terminal 118. In the bypass mode, the bypass path 110 is closed and the amplification path 108 is detuned to shift the power gain frequency response. The receive signal 112 is received from the input terminal 116 and is transmitted through the bypass path 110. The bypass path 110 attenuates the receive signal 112 and outputs the receive signal 112 from the output terminal 118.

The LNA circuit 114 in the amplification path 108 has an amplification device. In this example, the amplification device is a first field effect transistor (FET) 120 having a first gate 122, a first source 124, and a first drain 126. The first gate 122 is configured to receive the receive signal 112. A noise matching circuit 128 is coupled between the input terminal 116 and the first gate 122 to tune noise performance and to block DC and other low frequencies. The noise matching circuit 128 includes a capacitor 130 and an inductor 132. Also coupled to the first gate 122 is a biasing terminal 134 for receiving a biasing signal 136. The biasing signal 136 has a bias level and is applied to the receive signal 112 so that the receive signal 112 is received at the first gate 122 within the operating range for amplification of the first FET 120. The first source 124 of the first FET 120 is coupled to ground through an inductor 138. The inductor 138 is a source degeneration element which helps improve noise performance. The receive signal 112 is output from the first FET 120 at the first drain 126.

The LNA circuit 114 also includes a power terminal 140 for receiving the voltage from the power source that drives amplification by the first FET 120. An impedance matching circuit 142 is coupled between the power terminal 140 and the first drain 126 of the first FET 120. In this embodiment, the impedance matching circuit 142 has a matching capacitor 144, an matching/bias inductor 146, and a bypass capacitor 148 that are configured so that the impedance matching circuit 142 forms an L-section network. To maximize or at least increase the amount of power transferred from the power terminal 140 to the first FET 120 for amplification, the L-section network is configured to match an impedance at the power terminal 140 and the impedance at the first drain 126 of the first FET 120.

The first FET 120 in the example illustrated in FIG. 9 is an enhancement mode FET. In order for the first FET 120 to operate as the amplification device, the voltage level as seen at the first gate 122 should be higher than the voltage level at the first source 124 but lower than the voltage level seen at the first drain 126. The bias level of the biasing signal 136 and the voltage level of the voltage from the power source may be selected to provide for this arrangement. Alternatively, the first FET 120 may be a depletion mode FET. In this case, the bias level and the voltage level of the voltage from the power source should be selected to operate the depletion mode FET as the amplification device.

The LNA circuit 114 also includes a second FET 150 and a detuner component 152. The impedance matching circuit 142, the second FET 150, and the detuner component 152 form a tuning circuit 154 in the amplification path 108. For this particular embodiment, the output terminal 118 of the amplification path 108 is coupled to the capacitor 144 and the receive signal 112 is transmitted through the capacitor 144 to the output terminal 118 in the amplification mode. The tuning circuit 154 provides an impedance frequency response and is coupled to the first drain 126 of the first FET 120. Based on the resonance and characteristics of the impedance frequency response, the power gain frequency response of the amplification path 108 is set in accordance with the impedance frequency response. In this manner, the power gain frequency response defines a power gain resonance frequency band. The frequency location of a resonant frequency in the power gain resonance frequency band is set according to the impedance frequency response.

As shown in FIG. 9, the second FET 150 in the tuning circuit 154 includes a second gate 156, a second source 158, and a second drain 160. The second FET 150 is configured to operate as a switch. The second source 158 and the second drain 160 may be coupled between the detuner component 152 and the impedance matching circuit 142. In this embodiment, the second source 158 is connected to the detuner component 152 and the second drain 160 connects to the inductor 146 of the impedance matching circuit 142. The second gate 156 of the second FET 150 is coupled to receive a control signal 159 and the second FET 150 is operable to be turned on if a voltage level of the control signal 159 is above a turn-on voltage relative to the second drain 160 and the second source 158. In the bypass mode, the second FET 150 is turned on and the voltage level of the control signal 159 is above the turn-on voltage. On the other hand, the second FET 150 is operable to be turned off if the voltage level of the control signal 159 is below the turn-on voltage relative to the second drain 160 and the second source 158. In the amplification mode, the second FET 150 is turned off and the voltage level is below the turn-on voltage.

The bypass path 110 in the embodiment shown in FIG. 9 includes a third FET 162 and DC blocking components 163. The third FET 162 has a third gate 164, a third source 166, and a third drain 168. The third FET 162 is configured to operate as a switch. The third source 166 and the third drain 168 are coupled between the input terminal 116 and the output terminal 118. The bypass path 110 is open when the third FET 162 is switched off and the bypass path 110 is closed when the third FET 162 is switched on. The DC blocking components 163 are each capacitors that block DC and other low frequency components from the input terminal 116 and output terminal 118. In this embodiment, the third FET 162 also receives the control signal 159 and the third gate 164 of the third FET 162 and the second gate 156 of the second FET 150 are coupled to one another. As with the second FET 150, the third FET 162 is also operable to be turned on if the voltage level of the control signal 159 is above the turn-on voltage relative to the third drain 168 and third source 166. In the bypass mode, the third FET 162 is turned on and the voltage level of the control signal 159 is above the turn-on voltage. On the other hand, the third FET 162 is operable to be turned off if the voltage level of the control signal 159 is below the turn-on voltage relative to the third drain 168 and third source 166. In the amplification mode, the third FET 162 is turned off and the voltage level of the control signal 159 is below the turn-on voltage.

In this embodiment, the second FET 150 and the third FET 162 are each both depletion mode FETs. In depletion mode FETs, the turn-on voltage is negative relative to the drain and source. Thus, voltage level of the control signal 159 is above the turn-on voltage when a negative voltage greater than the turn-on voltage is seen at the second gate 156 relative to the second drain 160 and the second source 158. Similarly, the voltage level of the control signal 159 is above the turn-on voltage of the third FET 162 when a negative voltage greater than the turn-on voltage is seen at the third gate 164 relative to the third drain 168 and the third source 166. Note, however, that the voltage level of the control signal 159 does not necessarily need to be negative and may actually be positive relative to ground. Other embodiments may utilize enhancement mode FETs that require positive voltages at the gates relative to the sources and drains. However, depletion mode FETs simplify the design of the controller that controls the RF circuit 106 since negative charge pumps may be required to create negative voltages at the gates relative to ground in order for the positive voltages to be created relative to the drains and sources of the enhancement mode FETs.

The second FET 150 and the third FET 162 in FIG. 9 also have the same or similar characteristics. Thus, the control signal 159 may be generated by a controller similar to the controller 62 described in FIG. 5. On the other hand, in alternative embodiments, the second FET 150 and the third FET 162 may be designed to have different characteristics or may simply be provided in a configuration of the RF circuit 106 where presented to the second FET 150 and the third FET 162 do not permit for the same control signal 159 to be utilized. Thus, the controller may be similar to the controller 72 described in FIG. 6.

The first FET 120, the second FET 150, and the third FET 162 are all pseudomorphic high electron mobility transistor (pHEMT), also known as a modulation-doped FET (MOD-FET). The first FET 120, the second FET 150, and, the third FET 162 may be formed on the same substrate which in this example is a Galium Arsenide (GaAs) type substrate or Aluminum Galium Arsenide (AlGaAs) type substrates. GaAs type substrate and AlGaAs type substrates easily allow for depletion mode and enhancement mode FETs and thus allow for the first FET 120, the second FET 150, and the third FET 162 to be formed on the same substrate. Other components of the RF circuit 106 may be provided on the substrate as well. For example, in FIG. 9, the capacitor 130, inductor 132, the capacitor 144, the detuner component 152, and the DC blocking components 163 are all built on the same substrate. The inductor 146 and the capacitor 148 are each separately from the substrate through surface mount technology (SMD).

In this embodiment, a parasitic capacitance of the second FET 150 also affects the impedance frequency response of the tuning circuit 154 during the bypass mode and thus the second FET 150 also operates as a detuner component along with the detuner component 152. The capacitance values of the second FET 150 and the detuner component 152 do not have to be large. For example, the parasitic capacitance of the second FET 150 has a capacitance value of around 20 fF and the detuner component 152 may be a 0.2 pF MIM capacitor.

Due to the circuit topology of the RF circuit 106, the second FET 150 and the detuner component 152 may have no or a very small detrimental effect on the input intercept point (IIP3). In fact, the second FET 150 has actually been shown to improve IIP3. This may be due to parastics of the second FET 150 helping to tune the amplification path 108 during the amplification mode and improve the linearity of the first FET 120. Furthermore, parameters, such as turn-on voltage, can have a significant impact on IIP3 and the effects of the turn-on voltage of the second FET 150 may help improve the linearity of the first FET 120.

In other embodiments, the first FET 120, the second FET 150, and the third FET 162 may not be pHEMTs but rather may be a complementary metal-oxide-semiconductor (CMOS) type transistor, such as a metal-oxide-semiconductor field effect transistor (MOSFET) or Metal-Semiconductor Field Effect Transistors (MESFET), or the like. The substrate may alternatively be a silicon-on-insulator (SOI) type substrate, a silicon-on-sapphire (SOS) type substrate, or the like. However, SOI type substrates, silicon-on-sapphire type substrates, and GaAs type substrates and AlGaAs type substrates are not required. The particular substrate utilized to form the plurality of the first FET 120, second FET 150, and third FET 162 should be determined in accordance with factors associated with a particular application and circuit topology. For example, the selection of the substrate may be determined according to factors, such as, a required bandwidth response, distortion tolerances, cost, and the like. Furthermore, the first FET 120, the second FET 150, and the third FET 162 may not be formed on the same substrate but rather on different substrates. This may be the case, for example, if the particular design calls for both depletion mode and enhancement mode FETs and the particular FET devices selected in the design require a substrate type that does not easily form both depletion mode and enhancement mode FETs. Different substrates may be utilized to build two or more of FETs for the particular design.

Similarly, while building the capacitor 130, the inductor 132, the capacitor 144, the detuner component 152, and the DC blocking components 163 on the substrate is spatially efficient, these components are not required to be built on the substrate. SMD technology and the like may be utilized to provide these and similar components. Also, providing the inductor 146 and the capacitor 148 through SMD technology is one way of cost effectively allowing for the variation in component values during manufacturing. However, the inductor 146 and the capacitor 148 are not required to be built through SMD technology and may be built on the substrate. Although the component values of the inductor 146 and the capacitor 148 are sometimes too large to be included on the substrate, advancements in substrate technology allow components with ever increasing component values to be built on substrates. The RF circuit 106 illustrated in FIG. 9, as well as other embodiments, do not require circuit components, such as capacitors, inductors, or the like to be provided in any particular manner whether on the substrate or off the substrate. These design considerations may depend on factors associated with the particular application and circuit topology.

Figure 10:
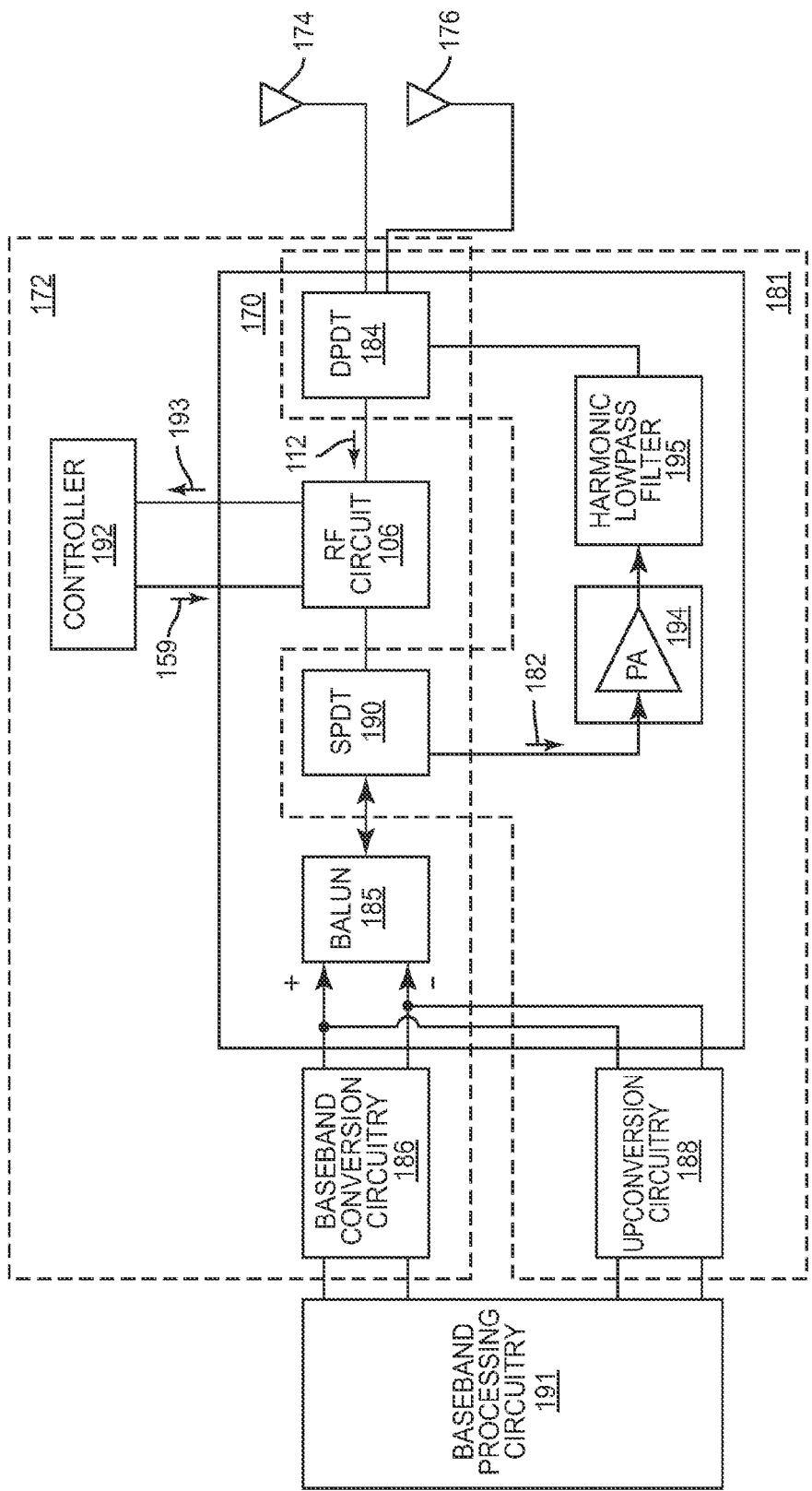
FIG. 10 is a block diagram of the RF circuit shown in FIG. 9 which has been formed in a front end module and provided within a receiver chain.

Referring now to FIGS. 9 and 10, FIG. 10 illustrates one implementation of the RF circuit 106. A 2.4 GHZ ZigBee front-end module 170 having product No. RF6555 has been modified to include the RF circuit 106. The front-end module 170 is designed to operate in the 2.4 to 2.5 GHz band and has been provided in a receiver chain 172. The receive signal 112 may be received either on a first antenna 174 or on a second antenna 176. The first antenna 174 and the second antenna 176 are each tuned to a receive frequency band, respectively. Both the first antenna 174 and the second antenna 176 can receive and transmit. The front-end module 170 is also part of a transmission chain 181 for a transmit signal 182.

A dual-pole, dual throw (DPDT) switch 184 is operable to select between the first antenna 174, the second antenna 176, and different channels within the receive frequency band. A single balun 185 is utilized to provide the receive signal 112 to a baseband conversion circuitry 186 within the receiver chain 172 and obtain the transmit signal 182 from an up conversion circuitry 188 in the transmission chain 181. A single pole, double throw (SPDT) switch 190 selects between the receive signal 112 and the transmit signal 182. Thus, the DPDT switch 184 and the SPDT switch 190 are part of both the receiver chain 172 and the transmission chain 181. The receive signal 112 is down converted to the baseband and information within the receive signal 112 is extracted by a baseband processing circuitry 191. This may involve analog to digital conversion. The baseband processing circuitry 191 also generates the transmit signal 182 and provides the transmit signal 182 to the transmission chain 181 at the baseband. This may involve digital to analog conversion. The up conversion circuitry 188 provides the transmit signal 182 within the appropriate transmit channel. In the front-end module 170, a power amplifier 194 amplifies the transmit signal 182 and a harmonic low-pass filter 195 filters the DC and other low frequency components.

The RF circuit 106 provides the low-noise amplification within the receiver chain 172 when the RF circuit 106 is in the amplification mode but does not amplify the receive signal 112 in the bypass mode. A controller 192 generates the control signal 159 and may operate similar to the controller 62 described above in FIG. 5. The controller 192 may receive a feedback signal 193 for sensing a signal level of the receive signal 112 to determine the voltage level of the control signal 159 and switch the RF circuit 106 to and from the amplification mode and the bypass mode. Alternatively, the controller 192 may be provided by the baseband processing circuitry 191, or the like.

Referring now to FIGS. 9 and 11A, FIG. 11A illustrates one embodiment of the $S_{21}$ response of the RF circuit 106 during the amplification mode when provided in the front-end module shown in FIG. 10. In the amplification mode, the $S_{21}$ response is a power gain frequency response 196 of the amplification path 108. As discussed above, the impedance frequency response of the tuning circuit 154 sets the power gain frequency response 196 of the amplification path 108. In the amplification mode, the tuning circuit 154 is configured to provide the impedance frequency response so that a power gain resonance frequency band 198 of the power gain frequency response 196 includes a receive frequency band 200 of the receive signal 112. In this case, the receive frequency band 200 is between around 2.4 to 2.5 GHz. In particular, the impedance matching circuit 142 has been tuned to provide the impedance frequency response so that the power gain resonance frequency band 198 of the amplification path 108 includes the receive frequency band 200. Accordingly, to provide the RF circuit 106 in the amplification mode, the second FET 150, and the third FET 162 are switched off by the control signal 159. In this manner, the detuner component 152 does not affect the impedance frequency response of the impedance matching circuit 142 and the bypass path 110 is open. Accordingly, the tuning circuit 154 of FIG. 9 provides the impedance frequency response so that the power gain resonance frequency band 198 includes the receive frequency band 200, as shown in FIG. 11A.

Note, in FIG. 11A, a frequency location 202 of the resonant frequency 206 of the power gain frequency response 196 is not within the receive frequency band 200 during the amplification mode. However, the power gain resonance frequency band 198 is within 3 dB of a resonant frequency 206 so that the power gain resonance frequency band 198 includes the receive frequency band 200. The frequency location 202 of the resonant frequency 206 may be outside of the receive frequency band 200 to improve in-band output return loss. Also, note that the balun 185 (shown in FIG. 10) may narrow the size of the power gain resonance frequency band 198. The impedance frequency response of the tuning circuit 154 shown in FIG. 9 is dominated by the inductor 146. The component value of the inductor 146 may be selected to optimize the output match at the output terminal 118 and thereby set the frequency location 202 of the resonant frequency 206 and the power gain resonance frequency band 198.

Referring now to FIGS. 9 and 11B, FIG. 11B illustrates one embodiment of the $S_{21}$ response of the RF circuit 106 when implemented in the front-end module 170 shown in FIG. 10 during the bypass mode. In the bypass mode, the $S_{21}$ response is an attenuation frequency response 204 of the bypass path 110. Note that attenuation increases in the attenuation frequency response 204 due to the amplification path 108 are relatively small in the receive frequency band 200. This is due to the power gain frequency response 196 of the amplification path 108 having been transposed, as shown in FIG. 11B. The resonant frequency 206 of the power gain resonance frequency band 198 is now outside of the receive frequency band 200 and is at frequency location 208.

Again, the impedance frequency response of the tuning circuit 154 sets the power gain frequency response 196 of the amplification path 108. In the bypass mode, the tuning circuit 154 is configured to provide the impedance frequency response so that the power gain resonance frequency band 198 of the power gain frequency response 196 is outside the receive frequency band 200 of the receive signal 112. In particular, the second FET 150 has been switched on by the control signal 159 and the detuner component 152 adjusts the impedance frequency response of the tuning circuit 154. Since the impedance frequency response of the tuning circuit 154 shown in FIG. 9 is dominated by the inductor 146, the detuner component 152 is a capacitor coupled to down shift the resonance of the RF circuit 106. However, the amplification path 108 does not amplify the receive signal 112 during the bypass mode. Rather, the third FET 162 is also switched on by the control signal 159 and the bypass path is closed. The receive signal 112 is transmitted through the bypass path 110 and attenuated according to the attenuation frequency response 204 of the bypass path 110. Nevertheless, the effects of increases in attenuation due to the resonance of the amplification path 108 are reduced by transposing the power gain frequency response 196. As show in FIG. 11B, the attenuation frequency response 204 defines a maximum attenuation resonance frequency 210 when the bypass path is closed. Due to loading, the LNA circuit (within amplification path 108) causes the maximum attenuation resonance frequency 210 to be within the power gain resonance frequency band 198. However, since the power gain frequency response 196 has been transposed, the maximum attenuation resonance frequency 210 is outside of the receive frequency band 200 during the bypass mode. As shown in FIG. 11B, the LNA circuit (within amplification path 108) is operable to set the power gain resonance frequency band 198 outside of the receive frequency band 200 such that the maximum attenuation resonance frequency 210 is at least 3 dB from the receive frequency band 200 during the bypass mode.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) circuit, comprising:
a low-noise amplification (LNA) circuit having a power gain frequency response that defines a power gain resonance frequency band wherein the LNA circuit is operable to amplify a receive signal transmitted within a receive frequency band in accordance with the power gain frequency response, the LNA circuit being configured to provide the power gain frequency response such that the receive frequency band is within the power gain resonance frequency band in an amplification mode and provide the power gain frequency response such that the power gain resonance frequency band is outside of the receive frequency band in a bypass mode; and
a bypass path operably associated with the LNA circuit to provide a bypass for the receive signal around the LNA circuit, the bypass path being configured to be closed during the bypass mode so that the receive signal bypasses the LNA circuit and being configured to be opened during the amplification mode so that the LNA circuit amplifies the receive signal.

2. The RF circuit of claim 1, wherein the bypass path has an attenuation frequency response that defines a maximum attenuation resonance frequency when the bypass path is closed, the bypass path being operable to attenuate the receive signal in accordance with the attenuation frequency response and being coupled to the LNA circuit such that the LNA circuit causes the maximum attenuation resonance frequency to be within the power gain resonance frequency band whereby the maximum attenuation resonance frequency is outside of the receive frequency band during the bypass mode.

3. The RF circuit of claim 1 wherein the receive frequency band is less than three (3) decibels of a resonant frequency of the power gain frequency response when within the power gain resonance frequency band and the receive frequency band is greater than three (3) decibels of the resonant frequency when the power gain resonance frequency band is outside of the receive frequency band.

4. The RF circuit of claim 1, further comprising:
an input terminal for receiving the receive signal;
an output terminal for outputting the receive signal;
the LNA circuit being coupled between the input terminal and the output terminal; and
the bypass path being coupled to the input terminal and the output terminal in parallel with the LNA circuit.

5. The RF circuit of claim 4, wherein the RF circuit defines an amplification path coupled between the input terminal and the output terminal, the amplification path including the LNA circuit.

6. The RF circuit of claim 4, wherein the LNA circuit further comprises:
a power terminal for receiving a voltage from a power source to drive amplification;
an amplification device operable to provide amplification in the LNA circuit, the amplification device including an input contact and an output contact wherein the input contact is operably associated with the input terminal to receive the receive signal and the output contact is configured to output the receive signal from the amplification device; and
an impedance matching circuit coupled between the power terminal and the output contact of the LNA circuit and the output terminal being coupled to the impedance matching circuit wherein the impedance matching circuit is configured to increase power transfer from the power terminal to the output contact and being tuned to provide the power gain frequency response so that the power gain resonance frequency band is within the receive frequency band wherein the impedance matching.

7. The RF circuit of claim 6, further comprising:
a detuner component;
a first switch coupled between the detuner component and the impedance matching circuit, the first switch being configured to be opened during the amplification mode so that the power gain resonance frequency band is within the receive frequency band and first switch being configured to be closed during the bypass mode thereby shifting the power gain frequency response so that the power gain resonance frequency band is outside of the receive frequency band.

8. The RF circuit of claim 7, further comprising:
the amplification device having an operating range;
a biasing terminal coupled to the input terminal and the input contact of the amplification device, the biasing terminal being configured to apply a biasing signal to the receive signal so that the receive signal is provided at the input contact within the operating range of the amplification device.

9. The RF circuit of claim 1, further comprising a control circuit operable to switch the RF circuit from the amplification mode to the bypass mode and from the bypass mode into the amplification mode.

10. The RF circuit of claim 9, further comprising a biasing circuit operable to generate a biasing signal for providing the receive signal within an operating range of the LNA device.

11. A radio frequency (RF) circuit for use within a receiver chain that obtains a receive signal transmitted within a receive frequency band from an antenna, comprising:
   an amplification path operable to amplify the receive signal in accordance with a power gain frequency response, the amplification path comprising:
      a first field effect transistor (FET) comprising a first gate configured to receive the receive signal, a first source, and a first drain;
      a tuning circuit configured to provide an impedance frequency response, the tuning circuit being operably associated with the first drain of the first FET such that the power gain frequency response of the amplification path is set in accordance with the impedance frequency response and the power gain frequency response of the amplification path defines a power gain resonance frequency band, wherein:
         in an amplification mode, the tuning circuit is configured to provide the impedance frequency response so that the power gain resonance frequency band of the power gain frequency response includes the receive frequency band;
         in a bypass mode, the tuning circuit is configured to provide the impedance frequency response so that the power gain resonance frequency band of the power gain frequency response is outside of the receive frequency band;
      a bypass path coupled to provide a bypass around the amplification path, wherein the bypass path is configured to be closed so that the receive signal bypasses the amplification path during the bypass mode and is configured to be opened so that the receive signal is amplified by the amplification path during the amplification mode.

12. The RF circuit of claim 11, further comprising:
   an input terminal for receiving the receive signal;
   an output terminal for outputting the receive signal;
   the amplification path being connected between the input terminal and the output terminal; and
   the bypass path being connected between the input terminal and the output terminal.

13. The RF circuit of claim 12, wherein the output terminal is connected to the tuning circuit.

14. The RF circuit of claim 11, wherein the tuning circuit is configured to operate with a controller that is operable to generate a control signal, the tuning circuit further comprises:
   an impedance matching circuit tuned to provide the impedance frequency response so that the power gain resonance frequency band includes the receive frequency band, the impedance matching circuit coupled to the first drain of the first FET;
   a detuner component; and
   a second FET having a second gate configured to receive the control signal from the controller, a second source, and a second drain, wherein the second source and the second drain are coupled between the detuner component and the impedance matching circuit and the second FET being operable to be turned on if a voltage level of the control signal is above a turn-on voltage relative to the second drain and the second source and being operable to be turned off if the voltage level of the control signal is below the turn-on voltage relative to the second drain and second source.

15. The RF circuit of claim 14, further comprising the controller wherein the controller is adapted to generate the control signal so that, in the amplification mode, the voltage level of the control signal is above the turn-on voltage relative to the second drain and the second source and so that, in the amplification mode the voltage level of the control signal is below the turn-on voltage relative to the second drain and the second source.

16. The RF circuit of claim 14, wherein the detuner component comprises a capacitor.

17. The RF circuit of claim 14, further comprising:
   an input terminal for inputting the receive signal;
   an output terminal for outputting the receive signal;
   the bypass path comprising a third FET, the third FET having a third gate coupled to receive the control signal, a third source, and a third drain, the third source and the third drain being coupled between the input terminal and the output terminal such that the bypass path such that the bypass path is open when the third FET is switched off and the bypass path is closed when the third FET is switched on, the third FET being operable to be turned on if the voltage level of the control signal is above the turn-on voltage relative to the third drain and the third source and being operable to be turned off if the voltage level of the control signal is below the turn-on voltage relative to the third drain and the third source.

18. The RF circuit of claim 17, wherein the second FET and the third FET are each depletion mode FETs and the third gate of the third FET is coupled to the second gate of the second FET.

19. The RF circuit of claim 17, further comprising:
   a power terminal for receiving a voltage from a power source to drive amplification; and
   the impedance matching circuit being coupled between the power terminal and the first drain of the first FET, the impedance matching circuit comprising a first inductor, a first capacitor, and a first inductor that are configured so that the impedance matching circuit forms a L-section network, L-section network being configured to match an impedance at the power terminal and an impedance at the first drain of the first FET.

20. The RF circuit of claim 17, further comprising a biasing terminal for receiving a biasing signal having a bias level wherein the biasing terminal is coupled to the first gate to apply the biasing signal to the receive signal.

21. The RF circuit of claim 17, wherein the first FET is an enhancement-mode FET and each of the second FET and the third FET are each depletion-mode FETs.

22. A method of controlling a low-noise amplification path and a bypass path provided within a receiver chain coupled to receive a receive signal in a receive frequency band from an antenna, the low-noise amplification path being operable to amplify the receive signal and the bypass path being coupled in parallel with the low-noise amplification path so that the receive signal bypasses the low-noise amplification path, wherein the method comprises:
   sensing that a signal level of the receive signal is below a threshold level;
   in response to sensing that the signal level of the receive signal is below the threshold level:

opening the bypass path so that the receive signal is amplified through the low-noise amplification path; and providing a power gain frequency response of the low-noise amplification path so that a power gain resonance frequency band of the power gain frequency response includes the receive frequency band;

sensing that the signal level of the receive signal is above the threshold level;

in response to sensing that the signal level of the receive signal is above the threshold level:

closing the bypass path so that the receive signal bypasses the low-noise amplification path; and providing the power gain frequency response of the low-noise amplification path so that the power gain resonance frequency band of the power gain frequency response is outside of the receive frequency band.

23. The method of claim 22, wherein the power gain frequency response of the low-noise amplification path includes the receive frequency band when a resonant frequency of the power gain resonance frequency band is less than three (3) decibels from the receive frequency band and the power gain frequency response of the low-noise amplification path is outside the receive frequency band when the resonant frequency of the power gain resonance frequency band is greater than three (3) decibels from the receive frequency band.

* * * * *